(12) United States Patent
Opris (10) Patent No.: US 7,378,881 B1
(45) Date of Patent: May 27, 2008

(54) VARIABLE GAIN AMPLIFIER CIRCUIT

(76) Inventor: Ion E. Opris, 2198 Lark Hills Ct., San Jose, CA (US) 95138

( * ) Notice: Subject to any disclaimer, the term of this patent is extended or adjusted under 35 U.S.C. 154(b) by 0 days.

(21) Appl. No.: 10/412,561

(22) Filed: Apr. 11, 2003

(51) Int. Cl.
*H03F 3/45* (2006.01)

(52) U.S. Cl. .................... 327/52; 327/53; 327/54; 330/134; 330/254; 330/282; 330/284

(58) Field of Classification Search ............ 327/52, 327/54, 65, 69, 74, 75, 82, 361; 330/147, 330/148, 200, 215
See application file for complete search history.

(56) References Cited

U.S. PATENT DOCUMENTS

| | | | | |
|---|---|---|---|---|
| 5,514,947 A | * | 5/1996 | Berg | 323/282 |
| 5,550,507 A | * | 8/1996 | Horl | 329/361 |
| 6,304,142 B1 | * | 10/2001 | Madni | 330/254 |
| 6,316,970 B1 | * | 11/2001 | Hebert | 327/67 |
| 6,552,580 B2 | * | 4/2003 | Nilson et al. | 327/66 |
| 6,608,527 B2 | * | 8/2003 | Moloudi et al. | 330/301 |
| 6,930,549 B2 | * | 8/2005 | Kajiwara et al. | 330/254 |
| 7,005,922 B2 | * | 2/2006 | Oshima et al. | 330/278 |
| 7,046,089 B2 | * | 5/2006 | Kwon et al. | 330/254 |
| 2006/0132235 A1 | * | 6/2006 | Ozawa | 330/254 |

\* cited by examiner

Primary Examiner—Tuan T. Lam
Assistant Examiner—Hiep Nguyen (57) ABSTRACT

Embodiments of a variable gain amplifier circuit are described. In one embodiment, multiple resistor devices are coupled in series to form a string of resistor devices and to receive an input current. A multiple input operational amplifier device has an amplifier output coupled to a feedback resistor in the string of resistor devices and multiple amplifier input pairs, each amplifier input being coupled into the string of resistor devices as a tap between two respective adjacent resistors, each amplifier input pair being controlled by a corresponding bias current transmitted from a respective bias current source.

18 Claims, 7 Drawing Sheets

VARIABLE GAIN AMPLIFIER CIRCUIT

FIELD OF THE INVENTION

The present invention relates generally to electronic circuits and, more particularly, to a variable gain amplifier circuit.

BACKGROUND OF THE INVENTION

For certain applications, variable gain amplifier circuits need to provide fine gain variation, i.e. fine variation of the ratio of resistors within the respective circuits.

Figure 1:
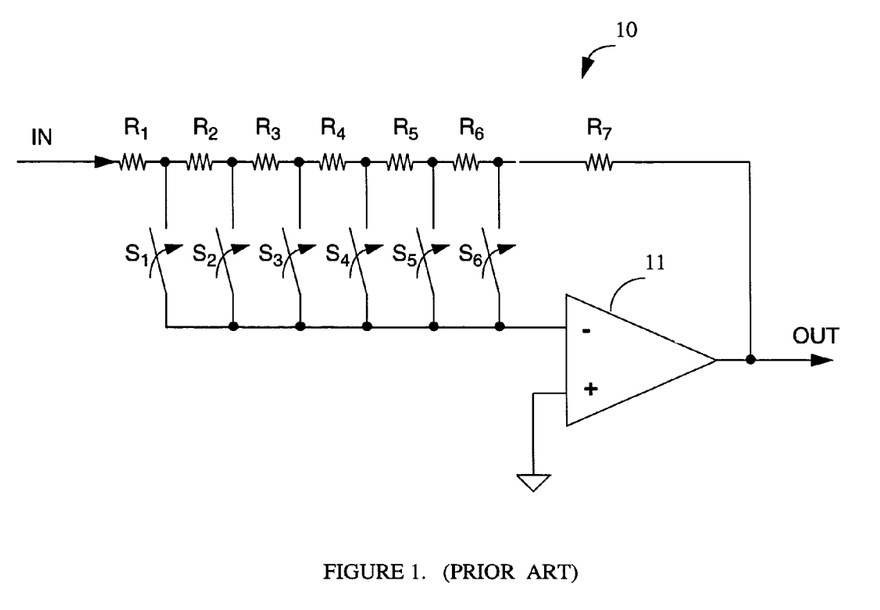
FIG. 1 is a schematic diagram of a prior art circuit to provide gain variation.

Several attempts have been made to vary the gain in such variable gain amplifier circuits. FIG. 1 is a schematic diagram of a prior art circuit 10 and represents one such prior attempt. The circuit 10 includes a string of resistors, of which resistors $R_1$ through $R_7$ are shown, and an operational amplifier 11. The negative input of the amplifier 11 is coupled to multiple switches, of which switches $S_1$ through $S_6$ are shown, each switch being also connected into the string of resistors $R_1$ through $R_7$. The output of the operational amplifier 11 is coupled to the feedback resistor $R_7$. In FIG. 1, the value of the gain depends on the particular switch being closed. For example, if switch $S_1$ is closed, the gain can be calculated with the formula $$g_1 = R_2 + R_3 + \ldots + R_7/R_1$$

Similarly, if switch $S_2$ is closed, the gain can be calculated as $g_2 = R_3 + \ldots + R_7/R_1 + R_2$.

Thus, fine variation of the value of the gain can be achieved if large numbers of resistors and switches are provided in the circuit 10, which leads ultimately to very complex and expensive circuits.

SUMMARY OF THE INVENTION

Embodiments for a variable gain amplifier circuit are described. In one embodiment, multiple resistor devices are coupled in series to form a string of resistor devices and to receive an input current. A multiple input operational amplifier device has an amplifier output coupled to a feedback resistor in the string of resistor devices and multiple amplifier input pairs, each amplifier input being coupled into the string of resistor devices as a tap between two respective adjacent resistors, each amplifier input pair being controlled by a corresponding bias current transmitted from a respective bias current source.

Other features and advantages of the present invention will be apparent from the accompanying drawings, and from the detailed description, which follows below.

BRIEF DESCRIPTION OF THE DRAWINGS

The present invention is illustrated by way of example and not intended to be limited by the figures of the accompanying drawings in which like references indicate similar elements and in which.

DETAILED DESCRIPTION

According to embodiments described herein, a variable gain amplifier is described. In one embodiment, multiple resistor devices are coupled in series to form a string of resistor devices and to receive an input current. A multiple input operational amplifier device has an amplifier output coupled to a feedback resistor in the string of resistor devices and multiple amplifier input pairs, each amplifier input being coupled into the string of resistor devices as a tap between two respective adjacent resistors, each amplifier input pair being controlled by a corresponding bias current transmitted from a respective bias current source.

In the following detailed description of embodiments of the invention, reference is made to the accompanying drawings in which like references indicate similar elements, and in which are shown by way of illustration specific embodiments in which the invention may be practiced. These embodiments are described in sufficient detail to enable those skilled in the art to practice the invention, and it is to be understood that other embodiments may be utilized and that logical, mechanical, electrical, functional, and other changes may be made without departing from the scope of the present invention. The following detailed description is, therefore, not to be taken in a limiting sense, and the scope of the present invention is defined only by the appended claims.

Figure 2:
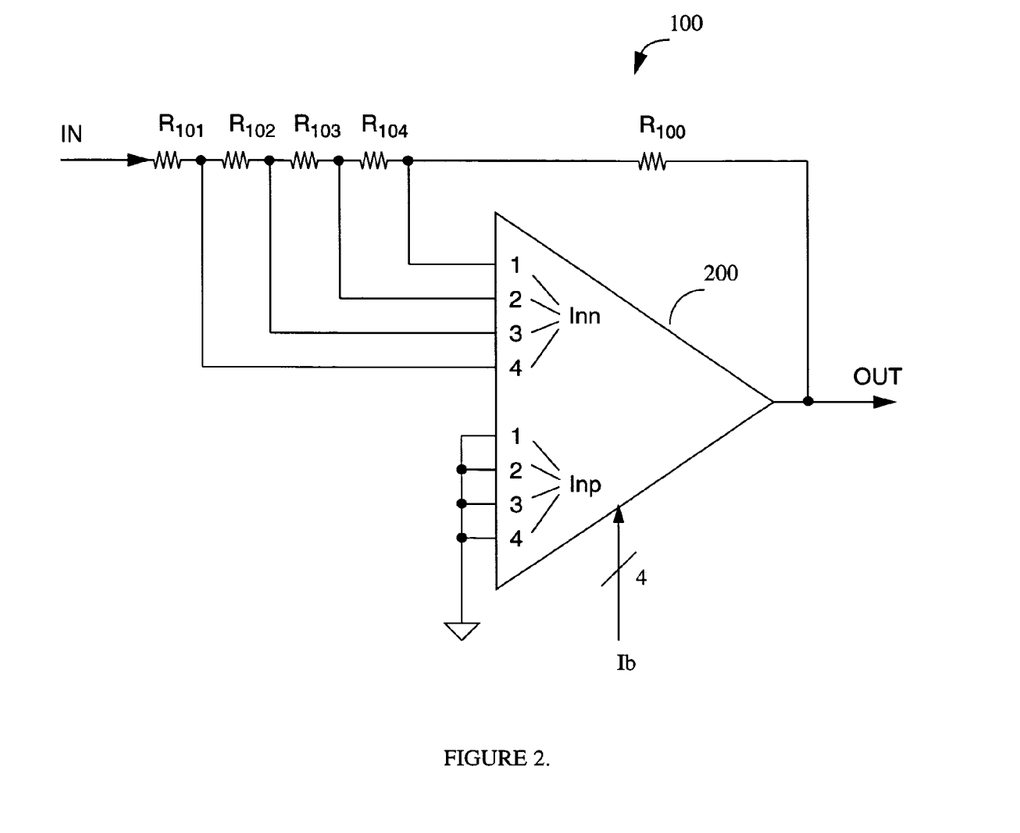
FIG. 2 is a schematic diagram of a variable gain amplifier circuit, according to one embodiment of the present invention.

FIG. 2 is schematic diagram of a variable gain circuit 100, according to one embodiment of the present invention. As illustrated in FIG. 2, in one embodiment, the variable gain circuit 100 includes multiple resistor devices $R_i$, of which resistor devices $R_{100}$ through $R_{104}$ are shown, coupled in series to the input $I_N$ of the circuit 100 and to an amplifier output OUT of a multiple input operational amplifier device 200.

In one embodiment, each amplifier input $I_{nn}$ of the amplifier device 200 is coupled into the string of resistor devices $R_i$ as a tap between two respective adjacent resistor devices in order to generate fixed gains. Alternatively, if the amplifier device 200 is fully differential, each amplifier input $I_{np}$ may be similarly coupled into the string of resistor devices. Each pair of corresponding amplifier inputs $I_{nn}$ and $I_{np}$ of the multiple input operational amplifier device 200 is controlled by a corresponding bias current $I_b$, which allows selection of one or more active amplifier input pairs and controls the variation of a calculated gain value within the circuit 100, as described in further detail below. Although only four amplifier input pairs are shown, for example $I_{nn1}$ through $I_{nn4}$ and $I_{np1}$ through $I_{np4}$ respectively, it is to be understood that multiple input operational amplifier device 200 may have any number of amplifier input pairs.

Figure 3:
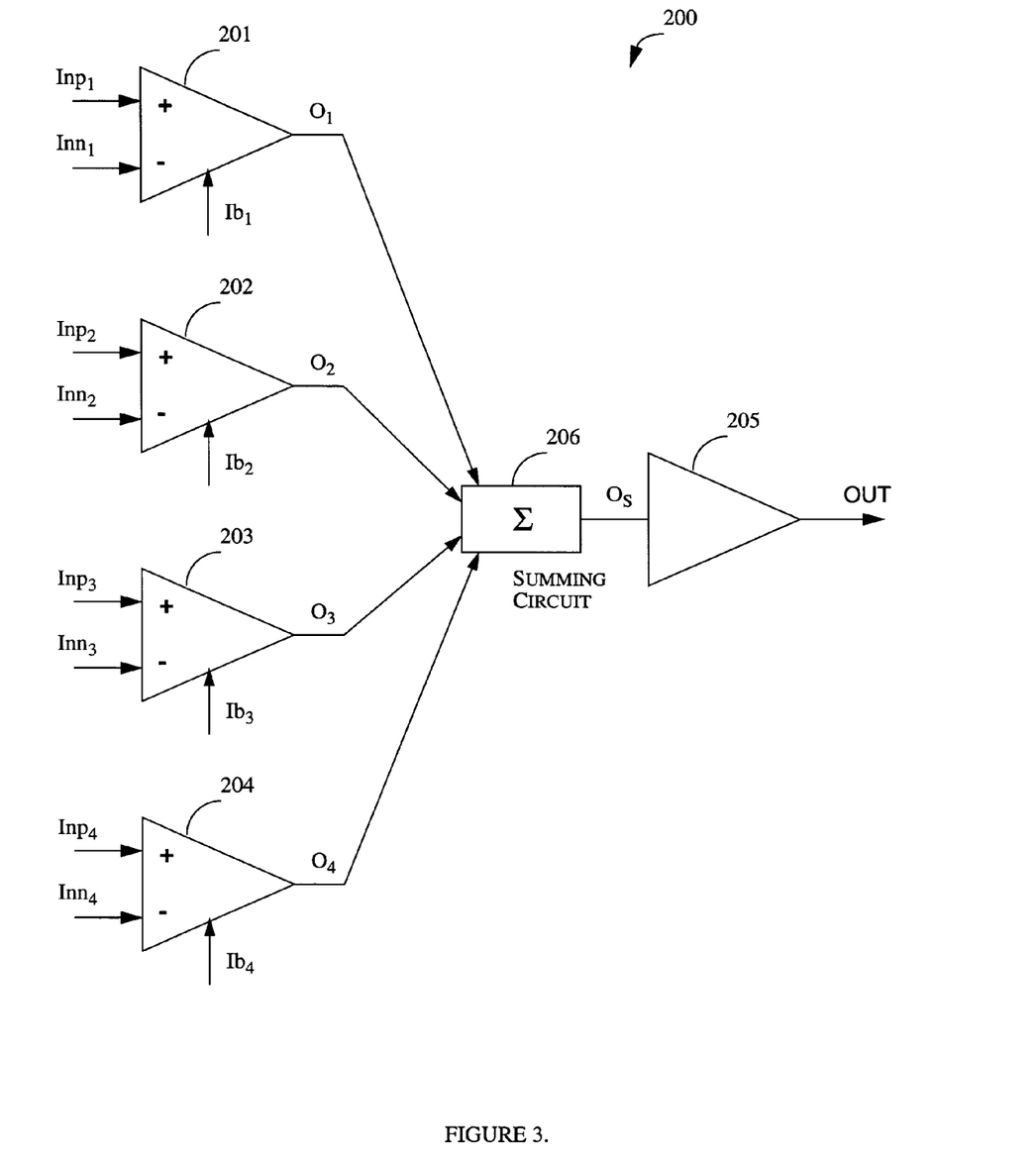
FIG. 3 is a schematic diagram of a multiple input operational amplifier device within the variable gain amplifier circuit, according to one embodiment of the present invention.

FIG. 3 is a schematic diagram of a multiple input operational amplifier device 200 within the variable gain amplifier circuit 100, according to one embodiment of the present invention. As illustrated in FIG. 3, the amplifier device 200 further includes multiple amplifier stages 201 through 204, for example transconductance stages wherein the output signal of each stage is a function of the input voltage. In one embodiment, each amplifier stage 201-204 transmits a single-ended stage output signal $O_i$, which corresponds to one amplifier input pair $I_{nni}$-$I_{npi}$ (i=1 through 4) of the amplifier device 200. Each stage 201-204 and each respective amplifier input pair are controlled by a corresponding bias current $I_{b1}$ through $I_{b4}$, which selects which input pair is active and, therefore, controls the gain variation within the variable gain circuit 100. In an alternate embodiment, each stage 201-204 may have a differential stage output.

In one embodiment, the output signals $O_1$ through $O_4$ are fed into a summing circuit 206 coupled to each amplifier stage 201-204. The summing circuit 206 sums up the output signals $O_1$ through $O_4$ in order to obtain a summing signal $O_s$ and transmits the summing signal $O_s$ to an output amplifier device 205. The output amplifier device 205 is coupled to each stage 201-204 via the summing circuit 206. In an alternate embodiment, if the output signals $O_1$ through $O_4$ are output currents, the summing circuit 206 may be a simple wire that leads to the summing of the output signals. In one embodiment, the output amplifier device 205 is single-ended. Alternatively, the output amplifier device 205 may be fully differential.

Referring to FIGS. 2 and 3, in one embodiment, if $I_{b1}$ is active, then the amplifier input pair $I_{nn1}$ and $I_{np1}$ is active, and the gain value can be calculated with the formula $g_1=r_{102}+r_{103}+r_{104}+r_{100}/r_{101}$, where $r_i$ represents the resistance value of the respective resistor device $R_i$. If $I_{b2}$ is active, then the respective inputs $I_{nn2}$ and $I_{np2}$ are active, and the gain is $g_2=r_{103}+r_{104}+r_{100}/r_{101}+r_{102}$. If, for example, both $I_{b1}$ and $I_{b2}$ are active, then the result will be equivalent with having an intermediate (virtual) connection on the resistor device $R_{102}$, in between the physical connections of inputs $I_{nn1}$ and $I_{nn2}$. Thus, a variation in the ratio between the bias currents $I_{b1}$ and $I_{b2}$ will result in a variation of the virtual connection on the resistor device $R_{102}$ and will further result in a fine variation of the gain value between the $g_1$ and $g_2$ values.

In one embodiment, the condition for the input voltage and output current equilibrium at each transconductance stage 201-204 is when the sum of all currents is zero. As a result, considering the example described in detail above, the bias currents $I_{b1}$ and $I_{b2}$ are inverse proportional. When $I_{b1}=I_{b2}$, then $I_{nn1}=-I_{nn2}$ and the intermediate virtual connection on the resistor $R_{102}$ is situated in the middle of the resistor.

Figure 4:
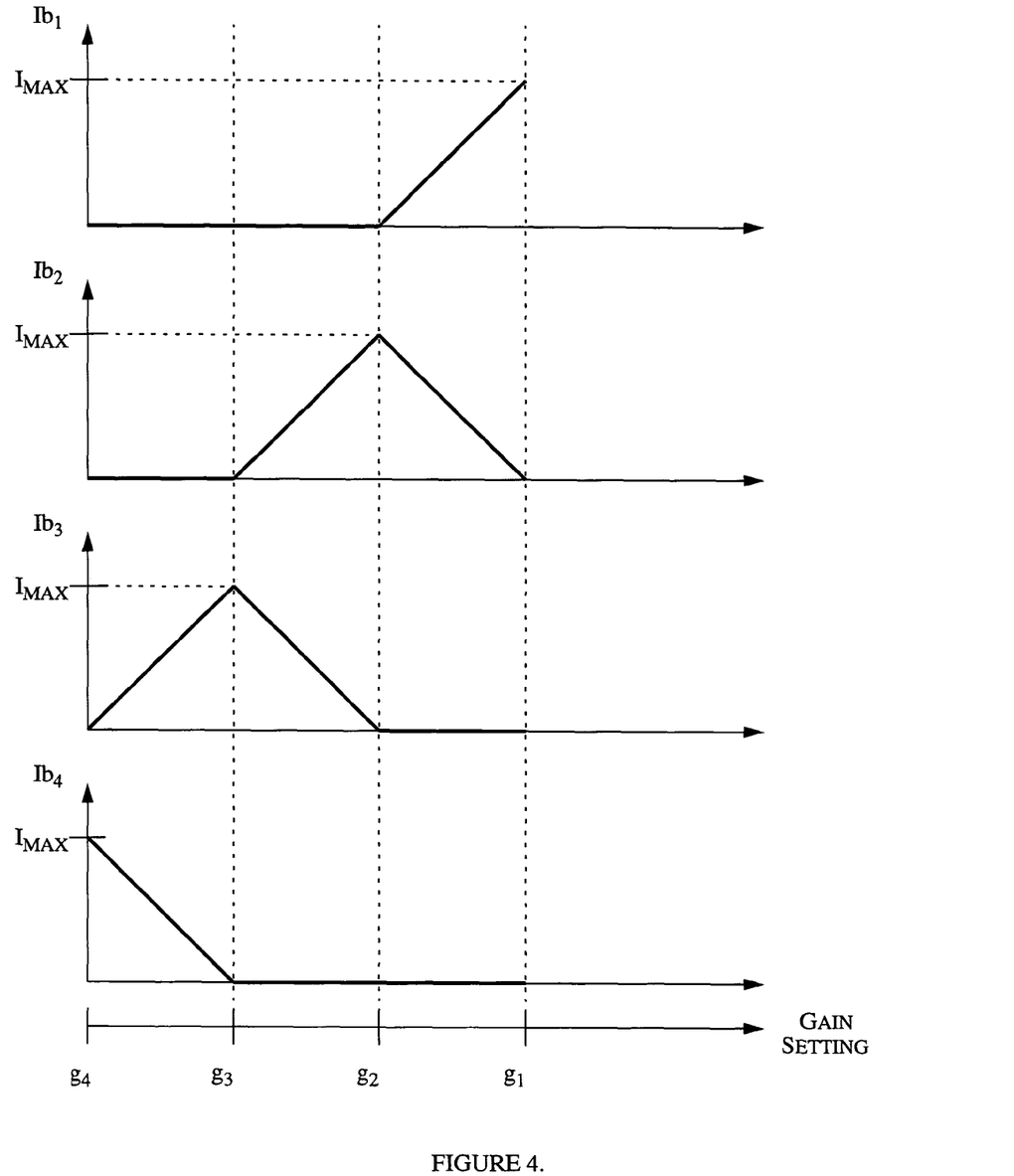
FIG. 4 is a diagram illustrating one embodiment of the gain variation as a function of the variation of bias currents within the multiple input operational amplifier device.

FIG. 4 is a diagram illustrating one embodiment of the gain variation as a function of the variation of bias currents $I_{b1}$ through $I_{b4}$ within the multiple input operational amplifier device 200. As illustrated in FIG. 4, the horizontal axis represents the gain setting and the vertical axis shows the bias currents $I_{b1}$ through $I_{b4}$.

Referring to FIG. 4, if $I_{b4}$ is active and has a maximum value, the gain $g_4=r_{100}/r_{101}+\ldots+r_{104}$ is minimal. By decreasing the value of $I_{b4}$ and increasing the value of $I_{b3}$, which also becomes active, the gain increases incrementally, until $I_{b4}$ reaches zero and $I_{b3}$ has a maximum value, and the gain $g_3=r_{104}+r_{100}/r_{101}+\ldots+r_{103}$. By further decreasing the value of $I_{b3}$ and increasing the value of $I_{b2}$, which becomes active, the gain continues to increase, until $I_{b3}$ reaches zero and $I_{b2}$ has a maximum value, and the gain $g_2=r_{103}+r_{104}+r_{100}/r_{101}+r_{102}$. Further decrease in the value of $I_{b2}$ and increase of the value of $I_{b1}$ allows a further gain increase, until $I_{b2}$ reaches zero and $I_{b1}$ has a maximum value, and the gain $g_1=r_{102}+r_{103}+r_{104}+r_{100}/r_{101}$.

Figure 5:
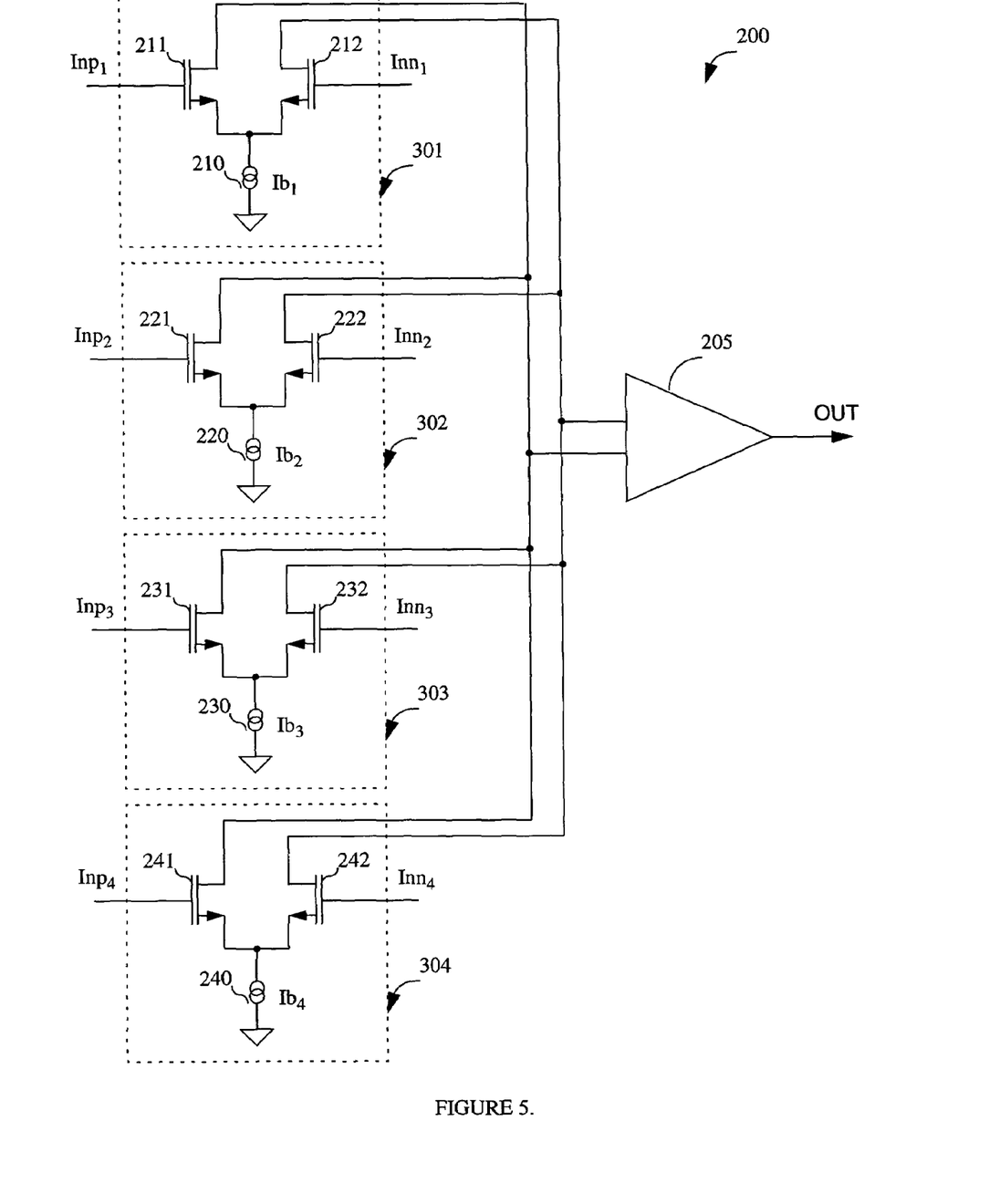
FIG. 5 is a schematic diagram of the multiple input operational amplifier device, according to an alternate embodiment of the present invention.

FIG. 5 is a schematic diagram of the multiple input operational amplifier device 200, according to an alternate embodiment of the present invention. As illustrated in FIG. 5, the multiple input operational amplifier 200 described in detail in connection with FIGS. 2-4 is implemented using multiple differential input stages 301 through 304. Each differential input stage 301-304 further includes one pair of transistor devices 211-212, 221-222, 231-232, and 241-242, respectively.

In one embodiment, the gates of the above transistor devices are the sets of differential amplifier inputs $I_{nn1}$ through $I_{nn4}$ and corresponding $I_{np1}$ through $I_{np4}$, respectively. The sources of the transistor devices 211 and 212 are coupled to each other and to a bias current source 210, which controls the bias current $I_{b1}$. The sources of the transistor devices 221 and 232 are coupled to each other and to a bias current source 220, which controls the bias current $I_{b2}$. The sources of the transistor devices 231 and 232 are coupled to each other and to a bias current source 230, which controls the bias current $I_{b3}$. Finally, the sources of the transistor devices 241 and 242 are coupled to each other and to a bias current source 240, which controls the bias current $I_{b4}$. The drains of transistors 212, 222, 232, and 242 are coupled to each other and are fed into one input of the output amplifier device 205. The drains of transistors 211, 221, 231, and 241 are coupled to each other and are fed into another input of the output amplifier device 205.

Figure 6:
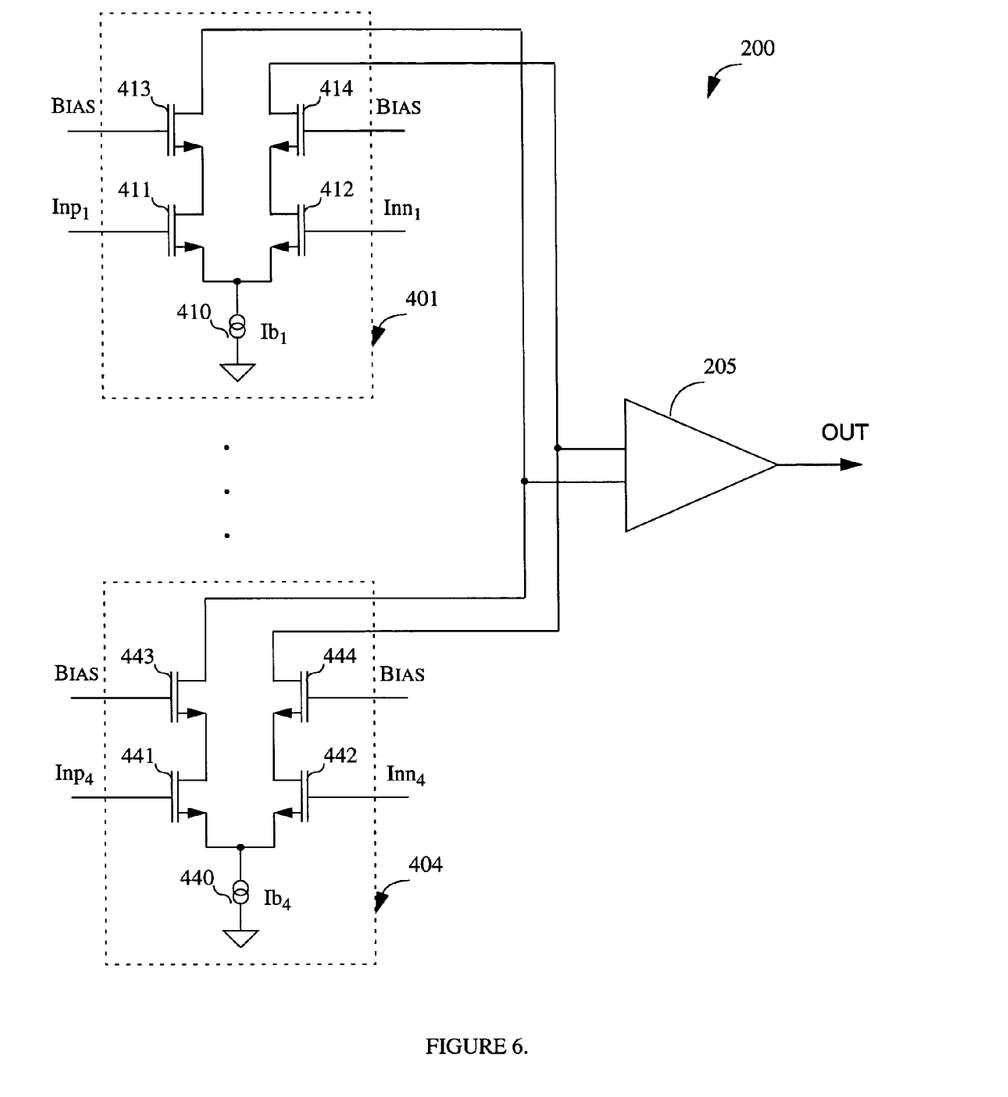
FIG. 6 is a schematic diagram of the multiple input operational amplifier device, according to another alternate embodiment of the present invention.

FIG. 6 is a schematic diagram of the multiple input operational amplifier device 200, according to another alternate embodiment of the present invention. As illustrated in FIG. 6, the multiple input operational amplifier device 200 described in detail in connection with FIGS. 2-5 is implemented using multiple differential input stages 401 through 404, each stage 401-404 including a cascode transistor circuit, which improves the output impedance of the configuration described in FIG. 5.

In one embodiment, each cascode transistor circuit within each stage 401-404 includes two or more transistor devices 411-412, 421-422, 431-432, and 441-442, respectively. The gates of the above transistor devices are the sets of differential amplifier inputs $I_{nn1}$ through $I_{nn4}$ and corresponding $I_{np1}$ through $I_{np4}$, respectively. The sources of the transistor devices 411 and 412 are coupled to each other and to a bias current source 410, which controls the bias current $I_{b1}$. The sources of the transistor devices 421 and 422 are coupled to each other and to a bias current source 420, which controls the bias current $I_{b2}$. The sources of the transistor devices 431 and 432 are coupled to each other and to a bias current source 430, which controls the bias current $I_{b3}$. Finally, the sources of the transistor devices 441 and 442 are coupled to each other and to a bias current source 440, which controls the bias current $I_{b4}$.

In one embodiment, the cascode transistor circuit within each stage 401-404 further includes corresponding cascode transistor devices 413-414, 423-424, 433-434, and 443-444, respectively. The cascode gates of the above cascode transistor devices receive a cascode bias current controlled simultaneously with the corresponding bias current $I_{b1}$ through $I_{b4}$. For example, if $I_{b1}$ is cut off and its value reaches zero, the corresponding cascode bias current is zero and cuts off completely the corresponding amplifier input pair $I_{nn1}$-$I_{np1}$.

In one embodiment, the cascode transistor devices 413-414, 423-424, 433-434, and 443-444 have cascode sources coupled to respective drains of the corresponding transistor devices 411-412, 421-422, 431-432, and 441-442. The cascode transistor devices 413, 423, 433, and 443 have cascode drains coupled to each other and to one input of the output amplifier device 205, while the cascode transistor devices 414, 424, 434, and 444 have cascode drains coupled to each other and to the other input of the output amplifier device 205.

Figure 7:
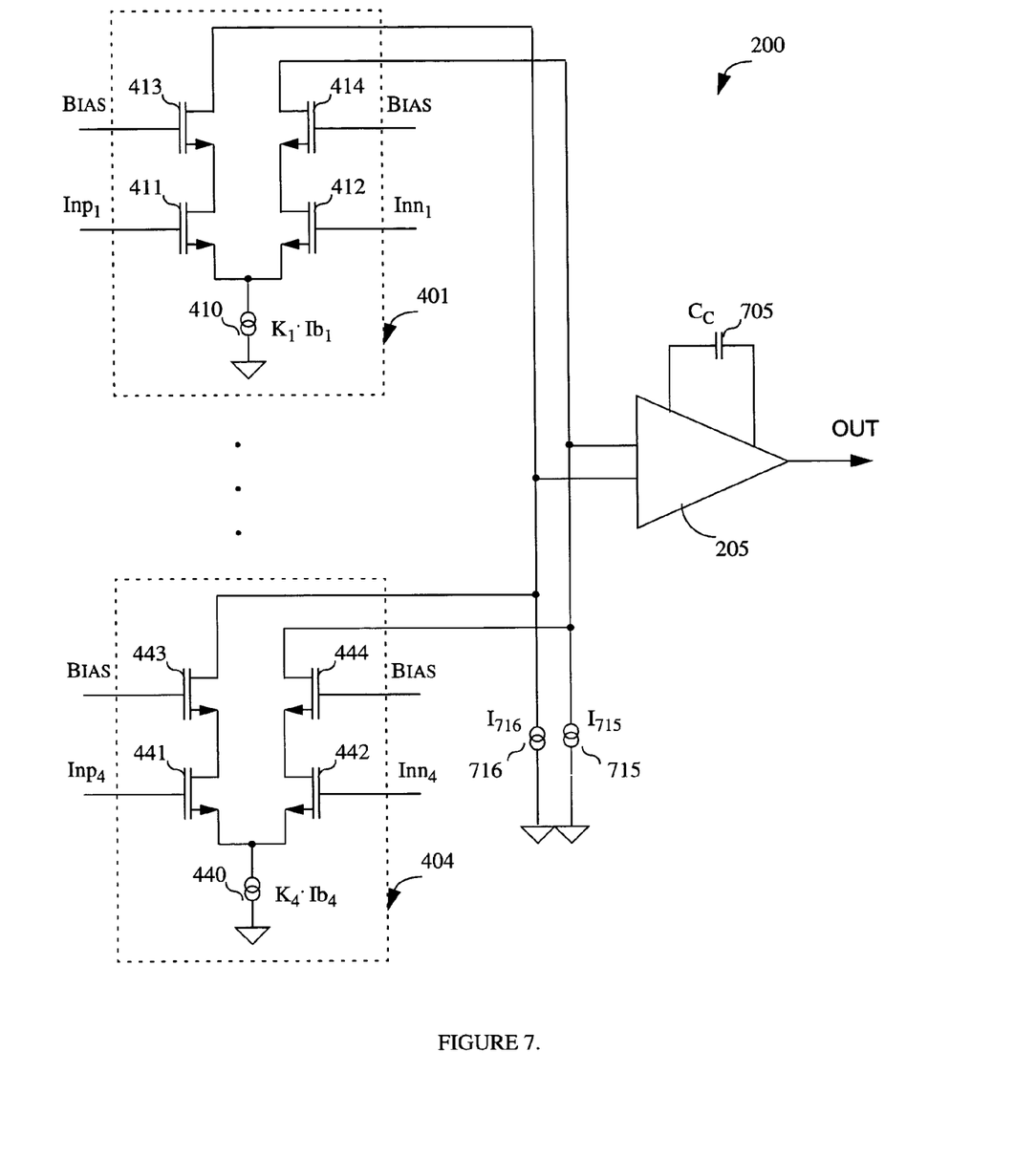
FIG. 7 is a schematic diagram of the multiple input operational amplifier device having constant closed loop bandwidth, according to one embodiment of the present invention.

FIG. 7 is a schematic diagram of the multiple input operational amplifier device 200 having constant closed loop bandwidth, according to one embodiment of the present invention. As illustrated in FIG. 7, the multiple input operational amplifier device 200 described in detail in connection with FIG. 6 further includes a frequency compensation capacitor $C_c$ 705 coupled to the output amplifier device 205 in order to improve stability on the feedback loop of the output amplifier device 205.

In one embodiment, an open loop bandwidth value of the output amplifier device 205 is equal to the transconductance of the first differential input stage 401 divided by the capacity value of the frequency compensation capacitor 705. Further, a closed loop bandwidth value of the output amplifier device 205 can be calculated as the open loop bandwidth value divided by a feedback factor, wherein the feedback factor is the ratio of resistors in the feedback loop and represents the amount of the output voltage that gets divided prior to returning to the input of the amplifier circuit 100.

In one embodiment, if the input pair $I_{nn1}$-$I_{np1}$ and the corresponding bias current $I_{b1}$ are active, the feedback factor is $$f_1 = r_{101}/r_{102} + r_{103} + r_{104} + r_{100} = 1/g_1$$

Therefore, since the closed loop bandwidth of the output amplifier device 205 depends on the feedback factor $f_1$, the closed loop bandwidth is also inverse proportional to the gain value $g_1$. However, in certain applications, it is desirable to have the closed loop bandwidth independent of the calculated gain value.

As a result, in one embodiment, a scale factor $k_i$ is added to the corresponding bias current $I_{bi}$ of each differential input stage 401-404 in order to scale the bias currents and the transconductance value of each stage. For example, if the amplifier input pair $I_{nn1}$-$I_{np1}$ and the corresponding bias current $I_{b1}$ are active, a scale factor $k_1$ is added to the bias current $I_{b1}$ to keep the closed loop bandwidth of the output amplifier 205 independent of the gain value $g_1$.

In one embodiment, concurrent with the variation of the bias currents into the amplifier input stages 401-404, in order to maintain a constant current into the bias of the output amplifier device 205, two additional current sources 715 and 716 are provided and coupled to each input of the output amplifier device 205, such that the sum of all currents into the bias of the output amplifier 205, in this case $I_S = k_1 I_{b1} + I_{715} + I_{716}$, has a constant value.

It is to be understood that embodiments of the present invention may be implemented not only within a physical circuit (e.g., on semiconductor chip) but also within machine-readable media. For example, the circuits and designs discussed above may be stored upon and/or embedded within machine-readable media associated with a design tool used for designing semiconductor devices. Examples include a netlist formatted in the VHSIC Hardware Description Language (VHDL) language, Verilog language or SPICE language. Some netlist examples include: a behavioral level netlist, a register transfer level (RTL) netlist, a gate level netlist and a transistor level netlist. Machine-readable media also include media having layout information such as a GDS-II file. Furthermore, netlist files or other machine-readable media for semiconductor chip design may be used in a simulation environment to perform the methods of the teachings described above. Thus, it is also to be understood that embodiments of this invention may be used as or to support a software program executed upon some form of processing core (such as the CPU of a computer) or otherwise implemented or realized upon or within a machine-readable medium. A machine-readable medium includes any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A circuit comprising:
a plurality of resistor devices coupled in series to form a string of resistor devices; and
an operational amplifier device coupled to said string of resistor devices and having a plurality of amplifier input pairs;
at least one amplifier input of each amplifier input pair being coupled to a tap between two respective adjacent resistor devices of said string of resistor devices and a gain of said each amplifier input pair being controlled by a corresponding bias current transmitted from a respective bias current source;
a plurality of said corresponding bias currents being concurrently active to control said gain of said each amplifier input pair, such that an overall gain of said circuit is varied continuously by values of at least one bias current.

2. The circuit according to claim 1, wherein said operational amplifier device further comprises:
a plurality of amplifier stages, each stage coupled to an amplifier input pair of said plurality of amplifier input pairs and receiving said corresponding bias current;
an output amplifier device coupled to said each stage, said each stage transmitting an output signal to said output amplifier device; and
at least one current source coupled to each input of said output amplifier device to maintain a constant current into the bias of said output amplifier device.

3. The circuit according to claim 2, wherein said each stage has a single-ended stage output.

4. The circuit according to claim 2, wherein said each stage has a differential stage output.

5. The circuit according to claim 2, wherein said operational amplifier device further comprises a summing circuit coupled to said each stage to receive and sum up said output signal of said each stage in order to obtain a summing signal and to transmit said summing signal to said output amplifier device.

6. The circuit according to claim 2, wherein said output signal of said each stage are summed up into a summing signal and transmitted to said output amplifier device.

7. The circuit according to claim 2, wherein said each stage is a multiple differential input stage further comprising at least two transistor devices having gates coupled to said respective amplifier input pair, sources coupled to each other and to said respective bias current source to receive said corresponding bias current, and drains coupled to respective inputs of said output amplifier device.

8. The circuit according to claim 2, wherein said each stage is a multiple differential input stage further comprising a cascode transistor circuit.

9. The circuit according to claim 8, wherein said cascode transistor circuit further comprises:
   at least two transistor devices having gates coupled to said respective amplifier input pair, sources coupled to each other and to said respective bias current source to receive said corresponding bias current; and
   corresponding cascode transistor devices having cascode gates to receive a cascode bias current controlled simultaneously with said corresponding bias current, cascode sources coupled to respective drains of said at least two transistor devices, and cascode drains coupled to respective inputs of said output amplifier device.

10. The circuit according to claim 2, wherein said operational amplifier device further includes a frequency compensation capacitor coupled to said output amplifier device to improve stability on a feedback loop of said output amplifier device.

11. The circuit according to claim 10, wherein said operational amplifier device further comprises:
   at least two transistor devices having gates coupled to said respective amplifier input pair, sources coupled to each other and to said respective bias current source to receive said corresponding bias current; and
   corresponding cascode transistor devices having gates to receive a cascode bias current controlled simultaneously with said corresponding bias current, cascode sources coupled to respective drains of said at least two transistor devices, and cascode drains coupled to respective inputs of said output amplifier device.

12. The circuit according to claim 11, wherein said corresponding bias current of said each stage is scaled using a respective scale factor in order to scale a transconductance value calculated for said each stage and to keep a closed loop bandwidth of said output amplifier device independent of a calculated gain value of said circuit.

13. The circuit according to claim 12, wherein said closed loop bandwidth is calculated as said transconductance value of said each stage divided by a capacity value of said frequency compensation capacitor and further divided by a feedback factor inverse proportional to said calculated gain value.

14. The circuit according to claim 1, wherein said operational amplifier device is a multiple input differential amplifier device.

15. The circuit according to claim 14, wherein two amplifier inputs of each amplifier input pair of said plurality of amplifier input pairs are coupled into said plurality of resistor devices as a tap between two respective adjacent resistors of said plurality of resistors.

16. A method to manufacture a circuit comprising:
   coupling a plurality of resistor devices in series to form a string of resistor devices; and
   coupling an operational amplifier device to said string of resistor devices, said operational amplifier device having a plurality of amplifier input pairs;
   at least one amplifier input of each amplifier input pair being coupled to a tap between two respective adjacent resistor devices of said string of resistor devices and a gain of said each amplifier input pair being controlled by a corresponding bias current transmitted from a respective bias current source;
   a plurality of said corresponding bias currents being concurrently active to control said gain of said each amplifier input pair, such that an overall gain of said circuit is varied continuously by values of at least one bias current.

17. The method according to claim 16, further comprising:
   coupling a plurality of amplifier stages to an output amplifier device within said operational amplifier device, each amplifier stage coupled to an amplifier input pair of said plurality of amplifier input pairs, receiving said corresponding bias current, and transmitting an output signal to said output amplifier device; and
   coupling a current source to each input of said output amplifier device to maintain a constant current into the bias of said output amplifier device.

18. The method according to claim 17, further comprising coupling a summing circuit to said each amplifier stage to receive and sum up said output signal of said each amplifier stage in order to obtain a summing signal and to transmit said summing signal to said output amplifier device.

* * * * *